US008441301B2

(12) United States Patent
Duby et al.

(10) Patent No.: US 8,441,301 B2
(45) Date of Patent: *May 14, 2013

(54) CASCODED LEVEL SHIFTER PROTECTION

(75) Inventors: Jean-Claude Duby, Saint Egreve (FR);
Fabrice Blanc, Vinay (FR)

(73) Assignee: ARM Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/313,075

(22) Filed: Dec. 7, 2011

(65) Prior Publication Data

US 2012/0146704 A1    Jun. 14, 2012

Related U.S. Application Data

(63) Continuation of application No. 12/662,501, filed on Apr. 20, 2010, now Pat. No. 8,093,938.

(30) Foreign Application Priority Data

Apr. 20, 2009    (GB) .................................... 0906778.6

(51) Int. Cl.
*H03L 5/00*    (2006.01)
(52) U.S. Cl.
USPC .............................. 327/333; 326/62; 326/81
(58) Field of Classification Search .............. 326/52–63, 326/80–82; 327/306, 333
See application file for complete search history.

(56) References Cited

U.S. PATENT DOCUMENTS

| 5,369,313 | A | * | 11/1994 | Yoshihara | ........................ | 326/68 |
| 6,157,223 | A | | 12/2000 | Blake | | |
| 7,199,617 | B1 | | 4/2007 | Schrom et al. | | |
| 7,443,200 | B2 | | 10/2008 | Quinn et al. | | |
| 7,466,184 | B2 | | 12/2008 | Ricard et al. | | |
| 8,093,938 | B2 | * | 1/2012 | Duby et al. | ................... | 327/333 |
| 2005/0285658 | A1 | | 12/2005 | Schulmeyer et al. | | |
| 2007/0279091 | A1 | | 12/2007 | Goel et al. | | |
| 2010/0109744 | A1 | * | 5/2010 | Czech et al. | .................. | 327/333 |

FOREIGN PATENT DOCUMENTS

WO    WO 2006/033638    3/2006

OTHER PUBLICATIONS

Search Report for GB 0906778.6 dated Aug. 20, 2009.

* cited by examiner

*Primary Examiner* — Dinh T. Le
(74) *Attorney, Agent, or Firm* — Nixon & Vanderhye P.C.

(57) ABSTRACT

A cascoded level shifter is subdivided into a first voltage section and a second voltage section, the first voltage section having a lower voltage supply than the second voltage section, and a combined voltage across the first voltage section and the second voltage section corresponding to the high voltage range. The shifter includes an input node receiving an input signal, a cascoded device disposed in one of the first voltage section and the second voltage section, the cascoded device includes a driver switch connected in series with a cascode switch at a midpoint node, the cascode switch switching in dependence on a reference voltage of a reference node and the input signal, and reference voltage perturbation circuitry configured to cause a transient perturbation to the reference voltage in response to a transition of the input signal to cause the cascode switch to switch.

12 Claims, 9 Drawing Sheets

Dynamic control of the PMOS cascoded voltage

Detection of commutation circuit

CASCODED LEVEL SHIFTER PROTECTION

This application is a continuation of U.S. application Ser. No. 12/662,501, filed on Apr. 20, 2010, now U.S. Pat. No. 8,093,938 which claims priority of United Kingdom Application No. 0906778.6 filed Apr. 20, 2009, the entire contents of each of which are hereby incorporated by reference.

BACKGROUND OF THE INVENTION

1. Field of the Invention

The present invention relates to cascoded level shifters and in particular to the protection of components of such cascoded level shifters.

2. Description of the Prior Art

It is known to provide level shifters which transform a signal in one voltage domain into an output signal in another voltage domain. For example, in the SOC (system-on-chip) context, whilst on-chip components may operate in a lower voltage domain, it is often desirable for those components to be able to pass signals off-chip, where such signals may be required to signal to devices operating in a higher voltage domain. This may be due to a given protocol to which the signals should adhere.

Whilst techniques are known for providing such functionality, difficulties arise with the trend for on-chip components becoming ever smaller. With state of the art CMOS technologies, both core and I/O (input-output) device power supplies have moved to lower voltages in order to reach the contemporary speed and power consumption levels required. In parallel, transistor dimensions and oxide thicknesses have also decreased.

For example, in 45 nm technologies, the "standard" external power is now 1.8V (where it was 3.3V or 2.5V). To be able to reach the high frequencies demanded of these 1.8V devices, the oxide thickness has decreased to around 28 to 32 Å (where it was previously around 50 Å).

However, in order to be compatible with older devices and some existing standard protocols, it is desirable for level shifter devices to be able to operate at a higher voltage than their nominal voltage (e.g. a level shifter operating at 1.8V nominal voltage being able to provide signals for a 3.3V voltage domain).

Such an arrangement can be problematic, due to the potential for components in the 1.8V voltage domain being exposed to excessive voltage differences, potentially overstressing those components. This overstress can lead to reduced component lifetimes due to such phenomena as oxide breakdown and hot carrier injection (HCI).

In particular, in the example of such level shifter devices which interface between two voltage domains, problems can arise during switching events (i.e. when the input signal transitions, thus causing the output signal to transition) when transient stress on components can easily arise. Experience has shown that these problems are particularly likely to arise in the cascoded devices in such level shifters.

Furthermore, in the context of these ever-smaller technology scales, it is typically a key requirement that power consumption should be kept as low as possible, meaning that it is highly desirable for the DC power consumption of such devices to be kept as low as possible.

FIG. 1 schematically illustrates a prior art level shifter 100 comprising PMOS driver switches 105 and 110, each cascoded with a PMOS cascode switch 115 and 120 respectively. Level shifter 100 further comprises NMOS driver switches 125 and 130, each cascoded with an NMOS cascode switch 135 and 140 respectively. The level shifter operates with reference to two voltage supplies, namely DVDD (3.3V) and DVDD2 (1.8V).

PMOS driver switches 105 and 110 are cross coupled, the gate of PMOS driver switch 105 being coupled to node B and the gate of PMOS driver switch 110 being coupled to node A.

PMOS cascode switches 115 and 120 have their respective gates connected together and tied to a reference voltage of 1.8V (DVDD2). Similarly NMOS cascode switches 125 and 140 have their respective gates connected together and tied to a reference voltage of 1.8V (DVDD2).

The input signal (IN) to the level shifter 100 is connected to the gate of NMOS driver switch 130, whilst the inverted input signal (NIN) is connected to the gate of NMOS driver switch 125. The high range output signal NOUTHIGH is generated at node B, whilst the low range output signal NOUTLOW is generated at node C.

Whilst this level shifter performs adequately during DC conditions, during transitions of the input/output signal there exists the risk of the cascoded devices being overstressed, as explained in the following.

In the example where input signal IN is at 0V before the transition, NOUTLOW is at 1.8V and the midpoint node MID between the upper and lower halves of the level shifter is at 3.3V. When a transition starts (in this case where input signal IN switches from low to high) NOUTLOW is pulled down very quickly by the switching of NMOS driver switch 130, but NMOS cascode switch 140 will remain off until its ground-source voltage (VGS) is above its threshold (>1 Vt). This then means that the MID node won't fall as quickly as NOUTLOW.

In consequence in the early stage of the transition, the drain-source voltage (VDS) of NMOS cascode switch 140 given by $V_{MID}$-$V_{NOUTLOW}$ can become rather high, stressing this switch and leading to a reduced lifetime due to the degrading phenomena mentioned above.

A similar problem can occur on the PMOS side for the opposite transition. When input signal IN is at 1.8V before the transition, NOUTHIGH is at 1.8V and the node MID is at 0V. When a transition starts (in this case where input signal IN switches from high to low) NOUTHIGH is pulled up very quickly by the switching of PMOS driver switch 110, but PMOS cascode switch 120 will remain off until its ground-source voltage (VGS) is above its threshold (>1 Vt). This then means that the MID node won't rise as quickly as NOUTHIGH.

In consequence in the early stage of the transition, the drain-source voltage (VDS) of PMOS cascode switch 120 given by $V_{NOUTHIGH}$-$V_{MID}$ can become rather high, stressing this switch and also leading to a reduced lifetime due to the degrading phenomena mentioned above.

Accordingly, it would be desirable to provide an improved technique which enabled cascoded level shifters to provide a power-efficient interface between voltage domains, without the components of those level shifters that are designed to operate at lower nominal voltages being stressed by exposure to excessive voltage differences resulting from the interface to a higher voltage domain.

SUMMARY OF THE INVENTION

Viewed from a first aspect, the present invention provides a cascoded level shifter for receiving an input signal in a low voltage range and for generating an output signal in a high voltage range, said cascoded level shifter being subdivided into a first voltage section and a second voltage section, said first voltage section having a lower voltage supply than said second voltage section, and a combined voltage across said first voltage section and said second voltage section corresponding to said high voltage range, said cascoded level shifter comprising: an input node configured to receive an input signal; a cascoded device disposed in one of said first voltage section and said second voltage section, said cascoded device comprising a driver switch connected in series with a cascode switch at a midpoint node, said cascode switch switching in dependence on a reference voltage of a reference node and said input signal; and reference voltage perturbation circuitry, configured to cause a transient perturbation to said reference voltage in response to a transition of said input signal to cause said cascode switch to switch.

In a cascoded level shifter configured to receive an input signal in a low voltage range and for generating an output signal in a high voltage range, the period immediately following a transition of the input signal has been identified as a moment in which cascode components of the cascoded level shifter can be stressed by transient excessive voltage differences. In particular, where the cascoded level shifter is subdivided into a first lower voltage section and a second higher voltage section, and the cascoded level shifter has a cascoded device in one of these two voltage sections formed of a driver switch connected in series with a cascode switch at a midpoint node, the cascode switch that switches in dependence on a reference voltage and the input signal is vulnerable to such transient voltage stresses.

According to the techniques of the present invention, reference voltage perturbation circuitry is provided, configured to cause a transient perturbation to the reference voltage in response to a transition of the input signal to cause the cascode switch to switch.

In this way, during this identified period in which these cascode switches are vulnerable, the provision of reference voltage perturbation circuitry, configured to cause a transient perturbation to the reference voltage in response to a transition of the input signal, causes the cascode switch to switch earlier than it would have otherwise done, and most significantly early enough that voltage overstress to the cascode switch is avoided. Hence, the durability and reliability of the cascoded level switcher in increased. Furthermore, the techniques of the present invention provide such advantages without resort to approaches that would result in DC power consumption during the non-transient state of the input/output signals.

In one embodiment, the cascoded device is disposed in said first voltage section; and said reference voltage perturbation circuitry comprises a capacitor connecting said reference node to said input node. When the cascoded device is disposed in the first (lower) voltage section, the cascode switch comprised in this cascode device is vulnerable to VDS (drain-source voltage) overstress on a rising transition of the input signal. By the elegant solution of connecting a capacitor between the reference node and the input node, a transient boost to the reference voltage at that reference node is provided, which may be arranged to be sufficient to switch the cascode switch early enough to avoid such VDS overstress.

In one embodiment the cascoded level shifter further comprises a further capacitor connecting said reference node to said mid-point node. This further capacitor may thus be arranged to limit the duration of the transient boost to the reference voltage at the reference node, to ensure that once a sufficient boost to the reference voltage has been provided, the reference voltage is swiftly returned to the original reference voltage, thus mitigating voltage overstress resulting from this transient boost lasting too long.

In another embodiment, the cascoded device is disposed in said second voltage section; and said reference voltage perturbation circuitry comprises a pull-down switch arranged to selectively couple said reference node to a ground voltage. When the cascoded device is disposed in the second (upper) voltage section, the cascode switch comprised in this cascode device is vulnerable to VDS (drain-source voltage) overstress on a falling transition of the input signal. By selectively connecting the reference node to ground, a transient forced decrease in the reference voltage at that reference node is provided, which may be arranged to be sufficient to switch the cascode switch early enough to avoid such VDS overstress.

In embodiments of the present invention said reference voltage perturbation circuitry further comprises a resistor connecting said reference node to a voltage source. The provision of this resistor allows the timing characteristics of the reference voltage perturbation circuitry to be further adjusted to suit the requirements of the transient perturbation to said reference voltage. In one embodiment this resistor comprises a PMOS transistor.

It may be desirable to set a strong DC level at the mid-point after a transition and in embodiments of the present invention said cascoded level shifter further comprises a further switch selectively connecting said mid-point node to a further voltage supply in dependence on said input signal. This helps to avoid DC leakage and to reduce jitter.

In some embodiments of the present invention said driver switch and said cascode switch are NMOS transistors, whilst in other embodiments said driver switch and said cascode switch are PMOS transistors.

Viewed from a second aspect the present invention provides a method of protecting a cascoded device of a cascoded level shifter, the cascoded level shifter being for receiving an input signal in a low voltage range and for generating an output signal in a high voltage range, said cascoded level shifter being subdivided into a first voltage section and a second voltage section, said first voltage section having a lower voltage supply than said second voltage section, and a combined voltage across said first voltage section and said second voltage section corresponding to said high voltage range, the method comprising the steps of: providing on a reference node a reference voltage for said cascoded device, said cascoded device being disposed in one of said first voltage section and said second voltage section, and said cascoded device comprising a driver switch connected in series with a cascode switch at a midpoint node; arranging said cascode switch to switch in dependence on said reference voltage and said input signal; receiving on an input node said input signal; and generating transient perturbation to said reference voltage in response to a transition of said input signal to cause said cascode switch to switch.

The above, and other objects, features and advantages of this invention will be apparent from the following detailed description of illustrative embodiments which is to be read in connection with the accompanying drawings.

DESCRIPTION OF EMBODIMENTS

Figure 1:
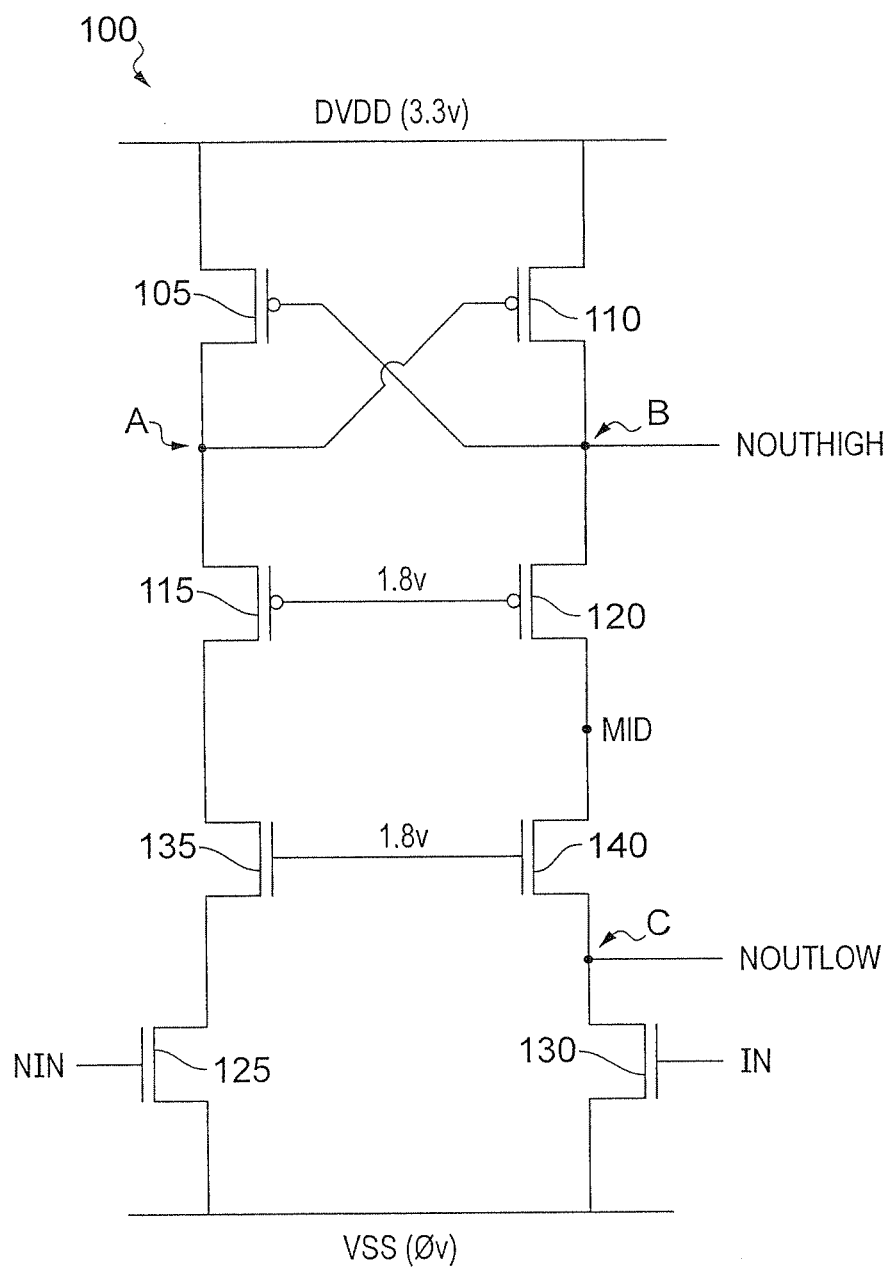
FIG. 1 schematically illustrates a prior art level shifter.
Figure 2:
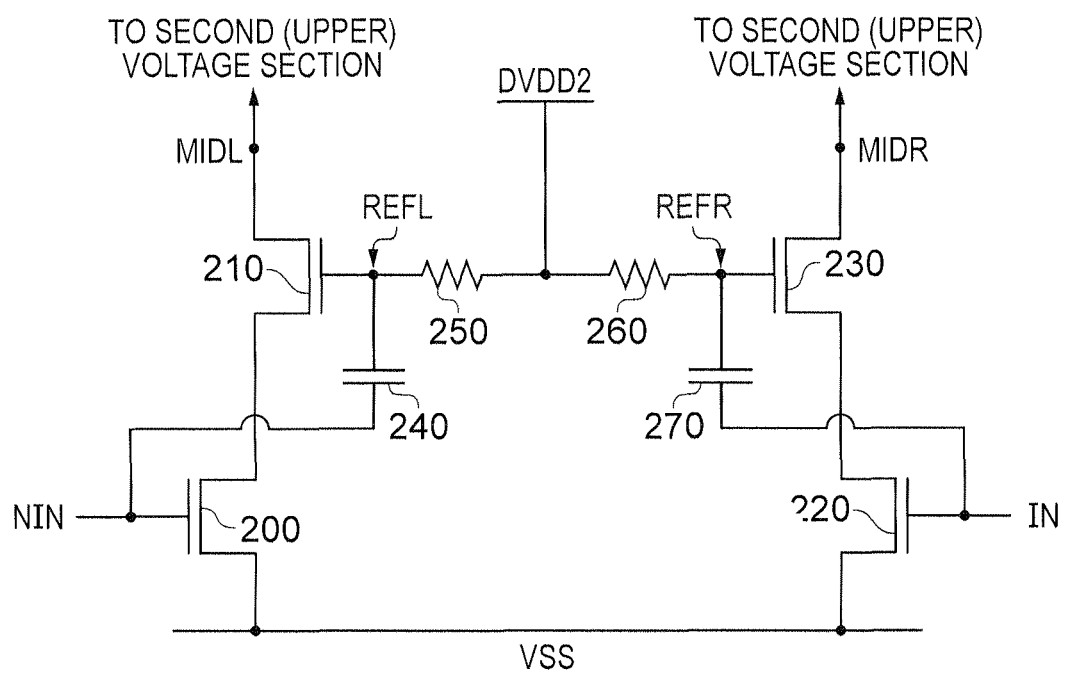
FIG. 2 schematically illustrates reference voltage perturbation circuitry according to one embodiment of the present invention.

FIG. 2 schematically illustrates the first (lower) voltage section of a cascoded level shifter according to one embodiment of the present invention. This lower voltage section comprises components configured to operate in a voltage range between VSS and DVDD2 (this being 0V to 1.8V). This section comprises two cascoded devices, the first comprising driver switch 200 and cascode switch 210 and the second comprising driver switch 220 and cascode switch 230. All four switches are embodied by NMOS transistors. The input signal IN to the level shifter is applied to the gate of driver switch 220, whilst the inverse of this input signal NIN is applied to the gate of driver switch 200.

This section of the level shifter further comprises two sets of reference voltage perturbation circuitry each formed of an RC circuit. On the left capacitor 240 and resistor 250 form one set of reference voltage perturbation circuitry. On the right capacitor 270 and resistor 260 form the other set of reference voltage perturbation circuitry. Thus it can be seen that cascode switches 210 and 230 have their gates tied together via resistors 250 and 260 respectively to the DVDD2 voltage source.

The provision of capacitors 240 and 270 result in the reference voltages at nodes REFL and REFR being boosted to rise above the DVDD2 level on a low-to-high transition of their respective input signal (IN or NIN). The resistors 250 and 260 limit the voltage level that REFL and REFR can reach. Hence, these boosts provided to the gate voltages of cascode switches 210 and 230 increase the ground-source voltage (VGS) of these cascode switches, meaning that on a rising transition of their respective input signal (NIN for cascode switch 210 and IN for cascode switch 230) these cascode switches will turn on faster, and hence the drain-source voltage (VDS), across them will not reach a level at which they can be stressed. Without these respective boosts at REFL and REFR the delayed fall of the mid-point nodes MIDL and MIDR respectively following the switching of driver switches 200 and 220 respectively would result in potentially damaging VDS levels across each cascode switch.

Figure 3:
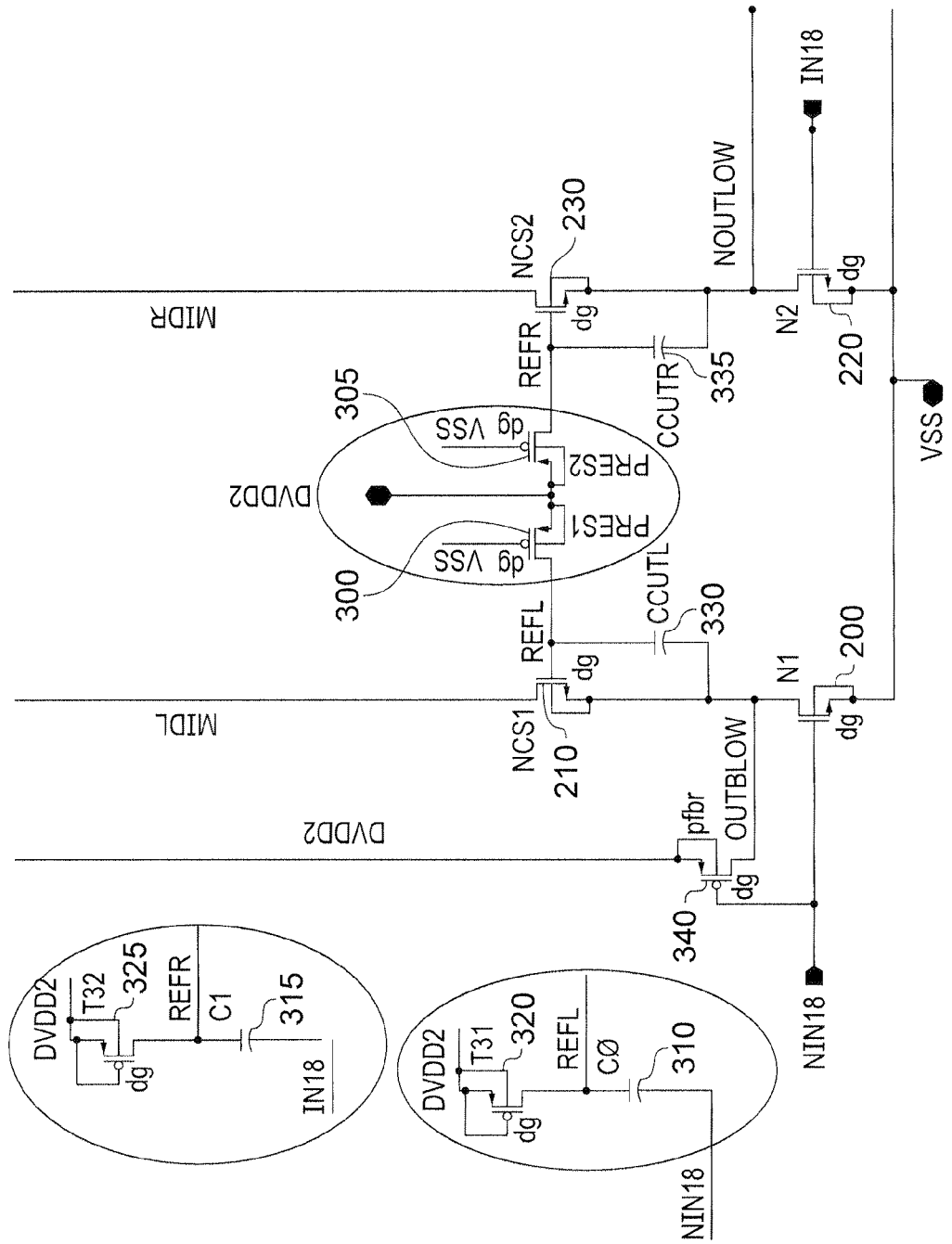
FIG. 3 schematically illustrates in more detail the reference voltage perturbation circuitry illustrated in FIG. 2.

The first (lower) voltage section of the cascode level shifter discussed in FIG. 2 is illustrated in greater detail in FIG. 3. NMOS driver switches 200 and 220 and NMOS cascode switches 210 and 230 are identical to those illustrated in FIG. 2. The gates of driver switches 220 and 200 are connected to the input signal (here labelled IN18) and its inverse (here labelled NIN18). The resistors 250 and 260 in FIG. 2 are implemented in the FIG. 3 illustrated embodiment by PMOS transistors 300 and 305 respectively, which each have their gate tied to VSS meaning that each operates as a resistive block between voltage source DVDD2 and the reference voltage nodes REFL and REFR respectively. Capacitors 240 and 270 illustrated in FIG. 2 are represented in FIG. 3 by capacitors 310 and 315 respectively. PMOS transistors 320 and 325 act as clamping devices that limit the rising of REFL and REFR to around DVDD2+1Vt.

Two further functional components illustrated in the FIG. 3 embodiment are the cut off capacitors CCUTL 330 and CCUTR 335. Cut off capacitor 330 connects the reference voltage point REFL to the mid-point node between cascode switch 210 and driver switch 200. Similarly, cut off capacitor 335 connects the reference voltage node REFR to the mid-point node between cascode switch 230 and driver switch 220. Whilst the reference voltage perturbation capacitors 310 and 315 are employed to prevent VDS stress on cascode switches 210 and 230, the cut off capacitors 330 and 335 are employed to prevent VGS stress on these cascode switches. This is because if (by the action of capacitors 310 or 315 on a rising edge of an input signal) RFEL or RFER were allowed to rise too high or to be too slow to return to DVDD2, the VGS of cascode switch 210 or 230 respectively could rise high enough to cause oxide breakdown on these components. The provision of cut off capacitors 330 and 335 linking their respective reference voltage nodes RFEL and RFER to the source side of cascode switches 210 and 230 force RFEL and RFER respectively to return quickly to DVDD2 when the rising transition of the input signal has completed.

Finally the PMOS switch 340 is provided to set a strong DC level at DVDD2 after the signal transition, helping to ensure no DC leakage and to reduce jitter in the system.

Figure 4:
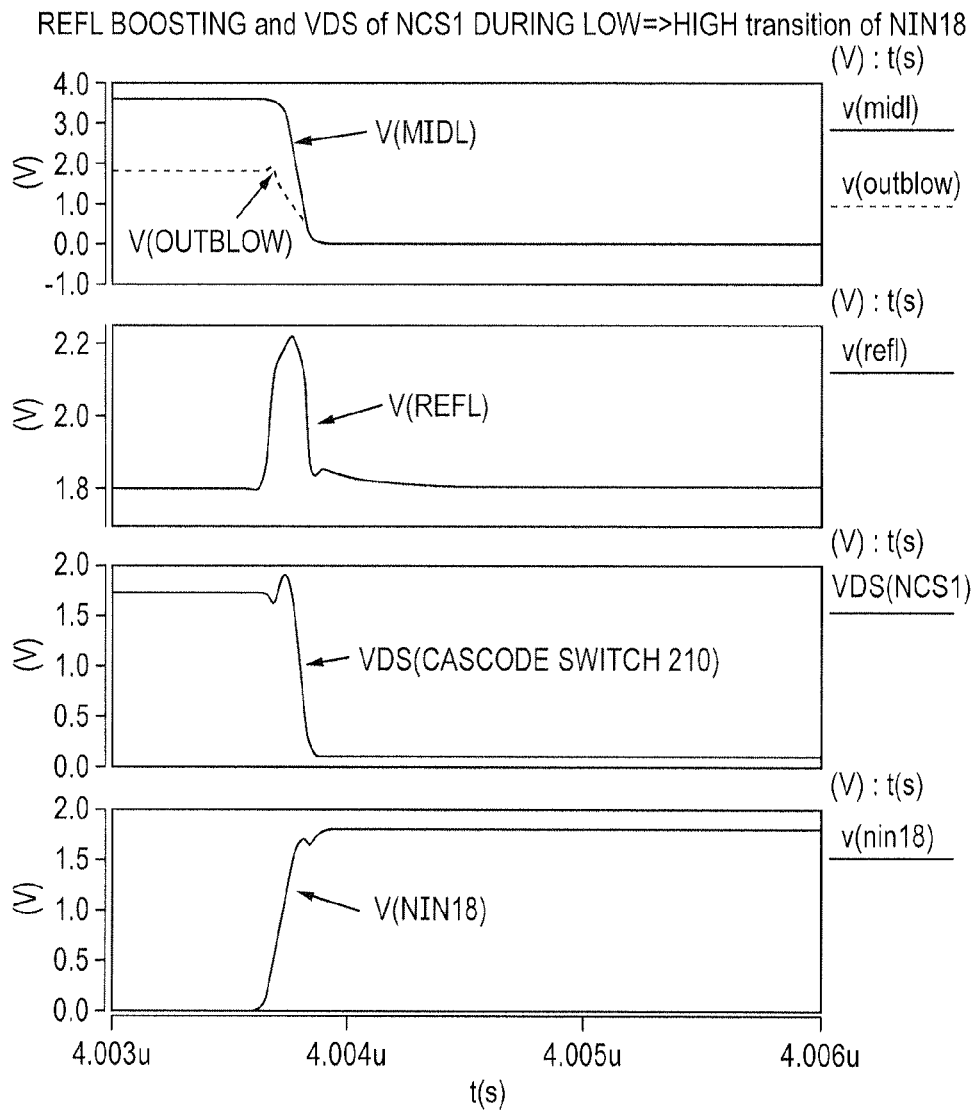
FIG. 4 shows the time evolution of various voltages in the FIG. 3 schematic during an input signal transition.

FIG. 4 illustrates the time evolution of the voltages at various points in the circuitry schematically illustrated in FIG. 3. In this example, a rising transition of the input signal NIN18 is shown. The local boost of the reference voltage REFL during the rising transition of NIN18 is clearly seen. Most importantly, only a small overshoot of the VDS at cascode switch 210 occurs and is limited to below 2.0V.

Figure 5:
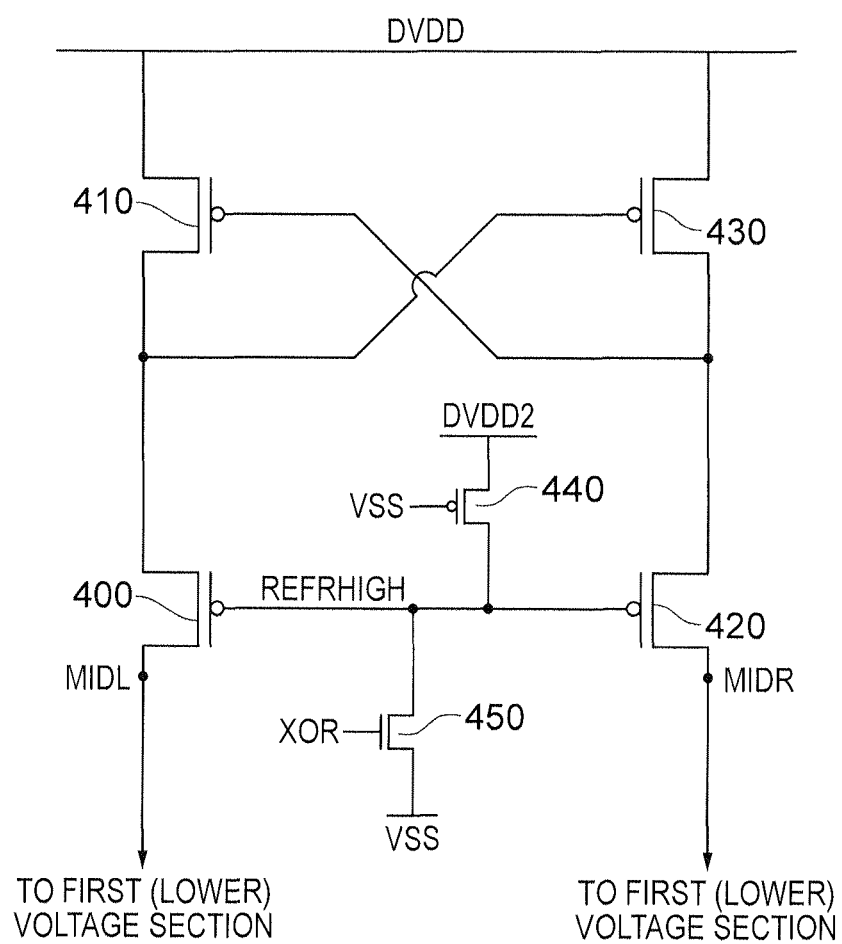
FIG. 5 schematically illustrates reference voltage perturbation circuitry according to another embodiment of the present invention.

Turning now to FIG. 5 the second (upper) voltage section of a cascoded level shifter according to one embodiment of the present invention is illustrated. Note that this is the same example embodiment as that illustrated in FIG. 2.

It should be noted that for PMOS devices the problem is the same, but it is addressed in a slightly different way. What is required is that the gate voltage of cascode switches 400 and 420 is reduced during the transition. The idea is to guarantee that the VGS of these devices is not zero (which means that 400 and 420 are off) to turn on PCS1 and PCS2 at the beginning of the transition and this helps to reduce the VDS stress on these devices. The gates of the two transistors 400 and 420 are connected to DVDD2 through PMOS transistor 440, and NMOS transistor 450 is used to selectively pull down the gate voltage REFRHIGH during the transition. Cascode switches 400 and 420 are coupled to DVDD via driver switches 410 and 430, respectively. By selectively connecting the reference node to VSS, a transient forced decrease in the reference voltage at that reference node is provided, which may be arranged to be sufficient to switch the cascode switch early enough to avoid such VDS overstress.

Figure 6:
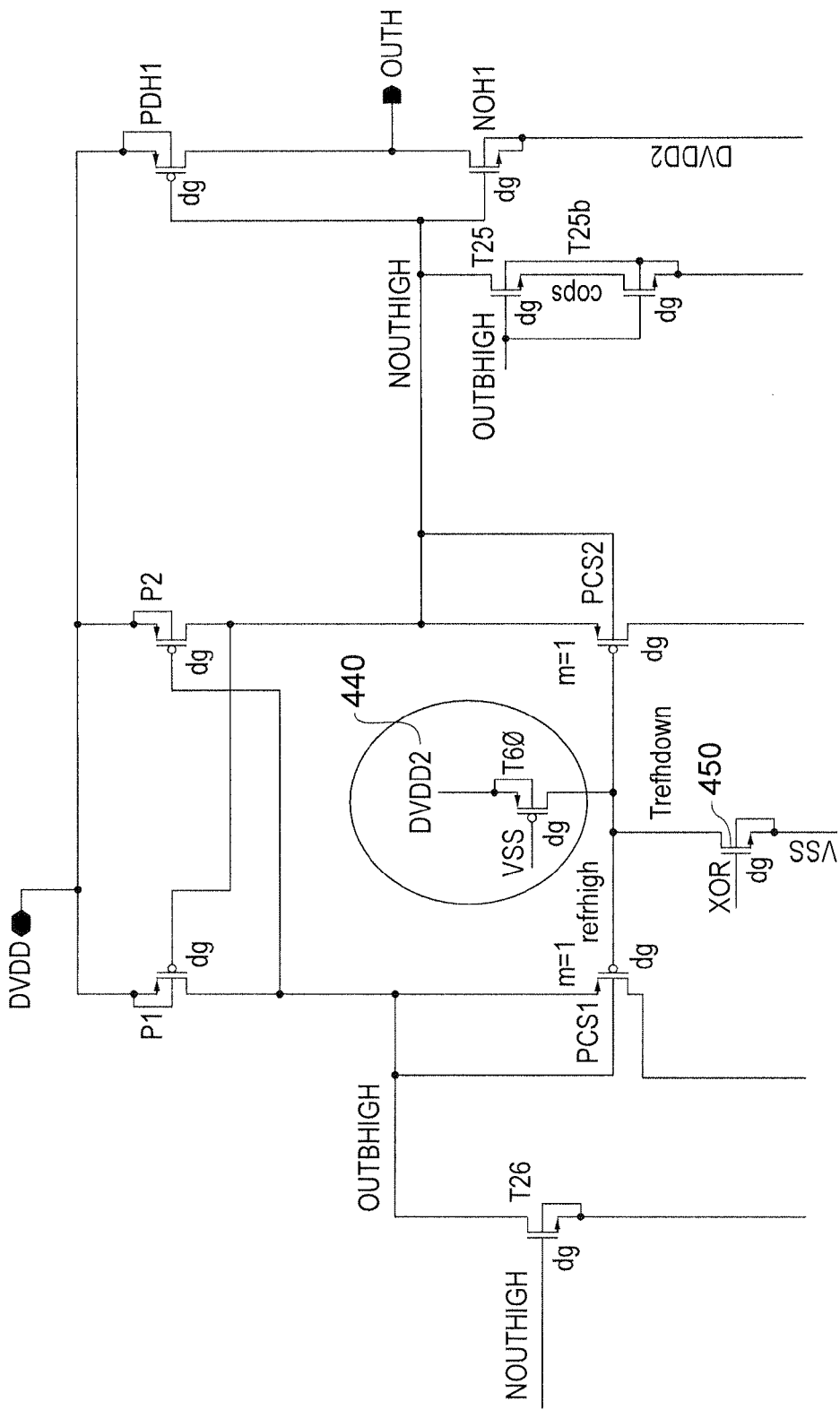
FIG. 6 schematically illustrates in more detail the reference voltage perturbation circuitry illustrated in FIG. 5.

FIG. 6 shows a similar circuit to that of FIG. 5, with PCS1 and PCS2 being equivalent to transistors 400 and 420 of FIG. 5. Transistor 450 is controlled by an XOR signal that is generated by the circuit of FIG. 7. Transistor 450 not only helps to reduce the VDS stress on PCS1 and PCS2 but it also helps increase the speed of the switch by reducing the gate voltage and turning on PCS1 and PCS2 faster. The PMOS transistor 440 is there to bring back refrhigh to DVDD2 and thus, ensure that no stress is induced by pulling the refrhigh signal down for too long.

Figure 7:
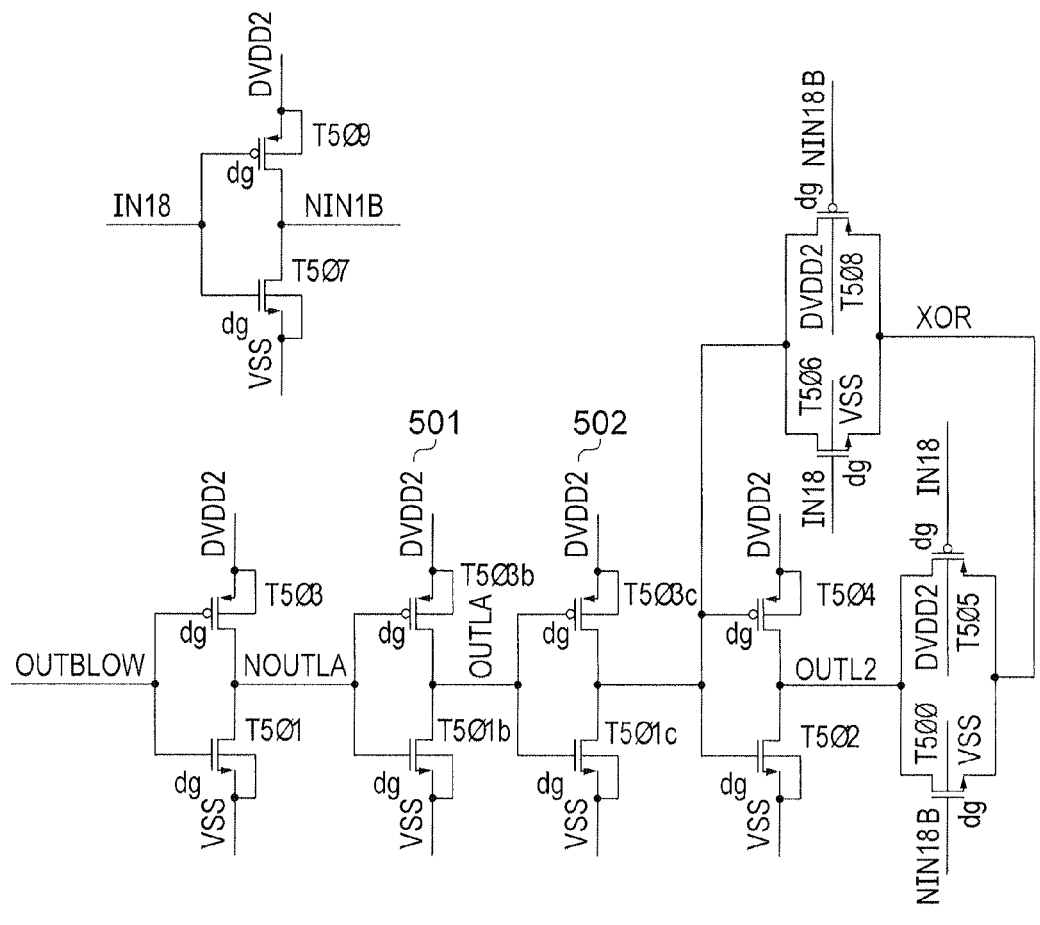
FIG. 7 schematically illustrates in more detail circuitry providing the XOR signal in FIG. 6.

FIG. 7 shows a circuit for detecting transitions and generating the XOR signal required to control the gate of transistor 450 of FIG. 6. This XOR is used to reduce the gate voltage when it detects a transition.

This detection circuit works like an XOR logical port and detects each transition, both rising and falling. It detects the transitions in the lower voltage section (DVDD2 to VSS) by sensing when IN18 and OUTBLOW of FIG. 3 are not equal. These signals will be equal when the system is stable and will not be equal when the level shifter is in the middle of a transition. The circuit generates a pulse of a certain width when the signals are not equal and this pulls down the refrhigh voltage for the required amount of time. The addition of circuit portions 501 and 502 in this Figure are to provide an additional delay to the generated XOR signal and can be used to design a circuit with the appropriate width. Clearly it is important when trying to avoid generating stress during a transition that the signals used to boost the voltage are generated at and maintained for a suitable time. If the signal is maintained for too long then this reduction on the gate voltage can generate its own voltage stress.

Figure 8:
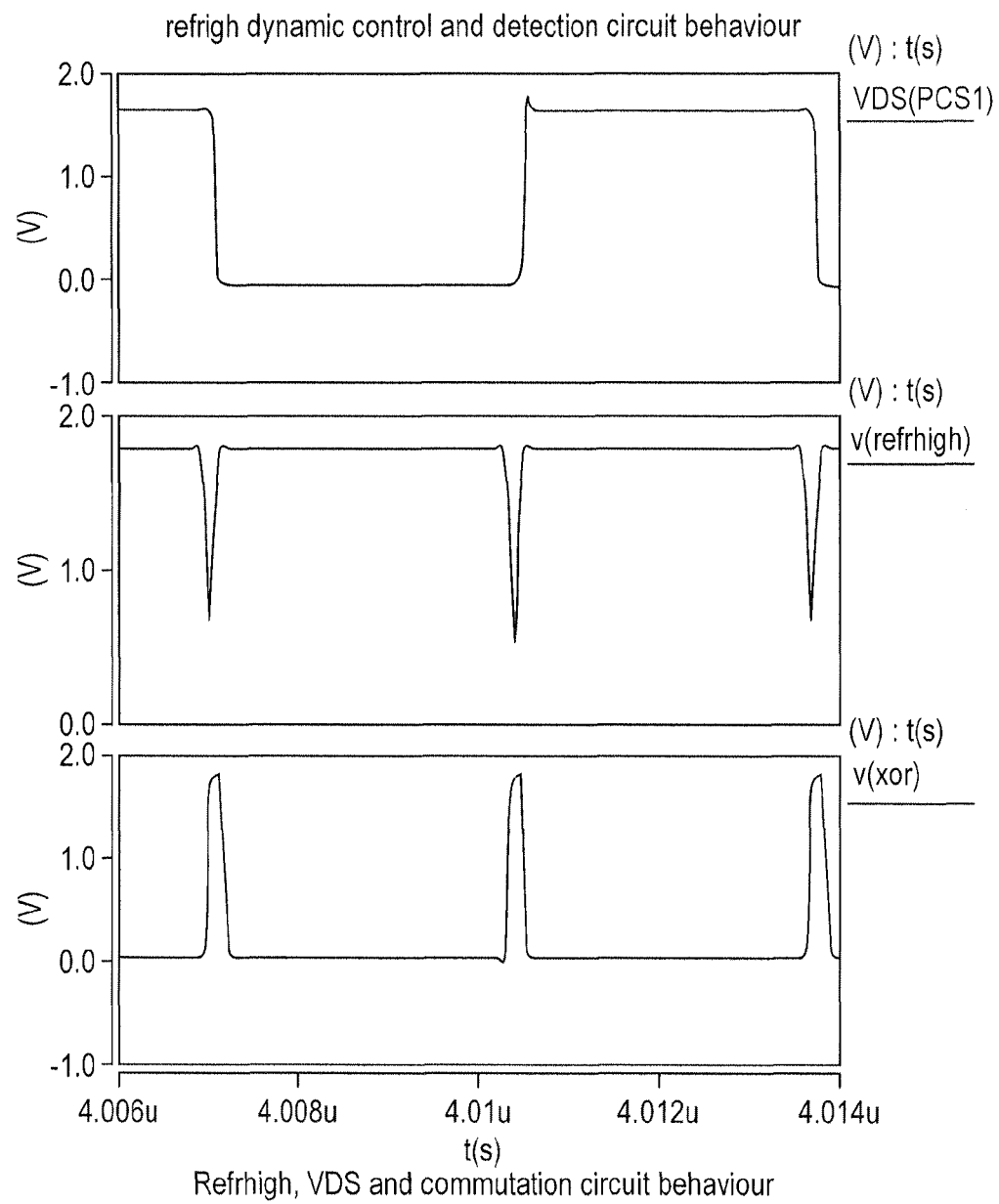
FIG. 8 illustrates the time evolution of various voltage signals in the circuitry illustrated in FIG. 6.

FIG. 8 shows timing diagrams of how the voltage varies for the circuit of FIG. 6. It shows how in response to the XOR signal generated by the circuit of FIG. 7, the voltage refrhigh is pulled down. As can be seen the voltage across the drain and source of PCS1 has a small overshoot on the rising edge, but this is below 2 V which is an acceptable stress for this device. Without the provision of this boosting system to pull down the voltage refrhigh at a transition this overshoot could rise to 3 V which could damage the transistor and reduce its lifetime.

Figure 9:
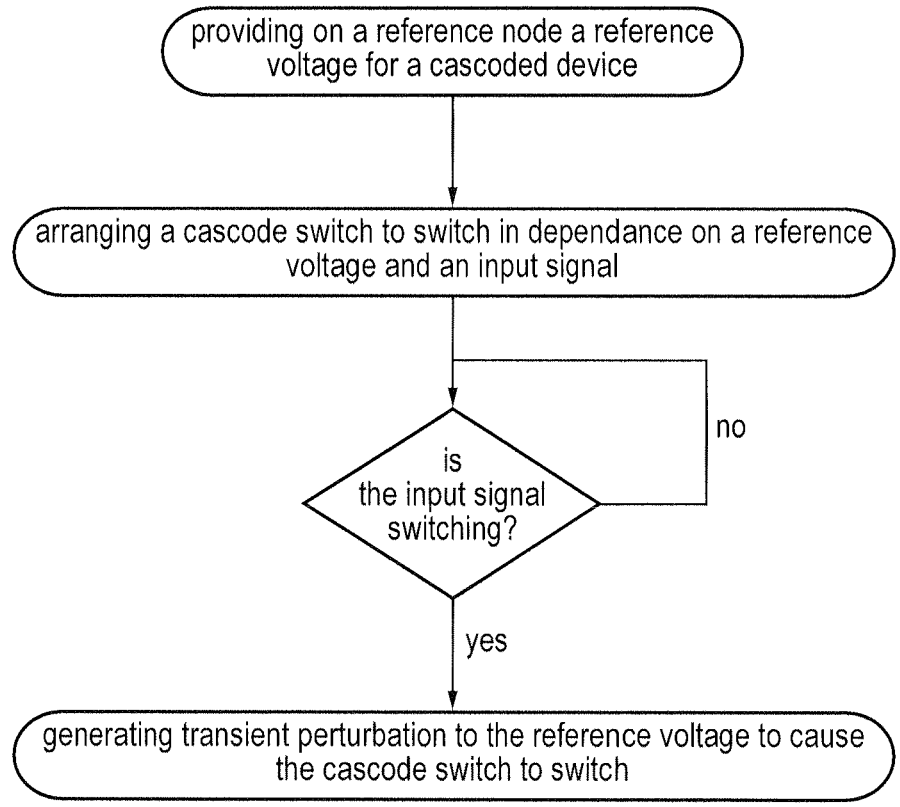
FIG. 9 shows a flow diagram illustrating steps in a method according to an embodiment of the present invention.

FIG. 9 shows a flow diagram showing the steps of a method according to an embodiment of the present invention. A reference voltage is supplied to a reference node for a cascoded device (REFL, REFR and refrhigh in the previous embodiments). Then in response to detecting that the input signal is switching a transient perturbation is provided to the reference voltage to cause the cascode switch to switch earlier than it would have switched without this transient perturbation. This transient perturbation may involve boosting a voltage, or pulling it down depending on the embodiment. It may be generated directly in response to the transient input signal itself using RC circuitry that transmits a transient signal, or it may be generated by separate circuitry that detects a transition and in response to it generates a signal to provide the transient perturbation to the reference voltage. Causing the cascode switch to switch earlier avoids overstressing of the device.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A cascoded level shifter for receiving an input signal in a low voltage range and for generating an output signal in a high voltage range,
    said cascoded level shifter being subdivided into a first voltage section and a second voltage section, said first voltage section having a lower voltage supply than said second voltage section, and a combined voltage across said first voltage section and said second voltage section corresponding to said high voltage range,
    said cascoded level shifter comprising:
        an input node in said first voltage section configured to receive an input signal;
        a first cascoded device disposed in said first voltage section, said first cascoded device comprising a first driver switch connected in series with a first cascode switch at a first midpoint node;
        a second cascoded device disposed in said second voltage section, said second cascoded device comprising a second driver switch connected in series with a second cascode switch at a second midpoint node, said second cascode switch switching in dependence on a reference voltage of a reference node and said input signal; and
        reference voltage perturbation circuitry configured to cause a transient perturbation to said reference voltage in response to a transition of said input signal to cause said second cascode switch to switch,
        wherein said reference voltage perturbation circuitry comprises a pull-down switch arranged to selectively couple said reference node to a ground voltage in dependence upon a signal generated in said first voltage section in response to detection of a transition of said input signal.

2. The cascoded level shifter as claimed in claim 1, comprising a further cascoded device disposed in said first voltage section;
    said further cascoded device comprising a further driver switch connected in series with a further cascode switch at a further midpoint node, said further cascode switch switching in dependence on a further reference voltage of a further reference node and said input signal;
    and said reference voltage perturbation circuitry further comprises a capacitor connecting said further reference node to said input node.

3. The cascoded level shifter as claimed in claim 2, further comprising a further capacitor connecting said further reference node to said further mid-point node.

4. The cascoded level shifter as claimed in claim 1, wherein said reference voltage perturbation circuitry further comprises a resistor connecting said reference node to a voltage source.

5. The cascoded level shifter as claimed in claim 4, wherein said resistor comprises a PMOS transistor.

6. The cascoded level shifter as claimed in claim 1, said cascoded level shifter further comprising a further switch selectively connecting said further mid-point node to a further voltage supply in dependence on said input signal.

7. The cascoded level shifter as claimed in claim 2, wherein said further driver switch and said further cascode switch are NMOS transistors.

8. The cascoded level shifter as claimed in claim 1, wherein said second driver switch and said second cascode switch are PMOS transistors.

9. The cascoded level shifter as claimed in claim 2, wherein said reference voltage perturbation circuitry further comprises a clamping device configured to limit a rise in said further reference voltage with respect to a voltage source.

10. The cascoded level shifter as claimed in claim 9, wherein said clamping device comprises a PMOS transistor coupled between said voltage source and said further reference node, a gate of said PMOS transistor being coupled to said voltage source.

11. A method of protecting a second cascoded device of a cascoded level shifter, the cascoded level shifter being for receiving an input signal in a low voltage range and for generating an output signal in a high voltage range, said cascoded level shifter being subdivided into a first voltage section and a second voltage section, said first voltage section having a lower voltage supply than said second voltage section, and a combined voltage across said first voltage section and said second voltage section corresponding to said high voltage range, the method comprising the steps of:

provalidng in said first voltage section a first cascoded device, said first cascoded device comprising a first driver switch connected in series with a first cascode switch at a first midpoint node;

providing on a reference node a reference voltage for said second cascoded device, said second cascoded device being disposed in said second voltage section, and said second cascoded device comprising a second driver switch connected in series with a second cascode switch at a second midpoint node;

arranging said second cascode switch to switch in dependence on said reference voltage and said input signal;

receiving on an input node in said first voltage section said input signal; and generating a transient perturbation to said reference voltage in response to a transition of said input signal to cause said second cascode switch to switch, wherein generating said transient perturbation to said reference voltage comprises selectively coupling said reference node to a ground voltage in dependence upon a signal generated in said first voltage section in response to detection of a transition of said input signal.

12. A cascoded level shifter means for receiving an input signal in a low voltage range and for generating an output signal in a high voltage range, said cascoded level shifter means being subdivided into a first voltage section and a second voltage section, said first voltage section having a lower voltage supply than said second voltage section, and a combined voltage across said first voltage section and said second voltage section corresponding to said high voltage range, said cascoded level shifter means comprising:

input node means in said first voltage section for receiving an input signal;

a first cascoded device means disposed in said first voltage section, said first cascoded device means comprising a first driver switch means connected in series with a first cascode switch at a first midpoint node;

a second cascoded device means disposed in said second voltage section, said second cascoded device means comprising a second driver switch means connected in series with a second cascode switch means at a second midpoint node, said second cascode switch means for switching in dependence on a reference voltage of a reference node and said input signal; and reference voltage perturbation means for causing a transient perturbation to said reference voltage in response to a transition of said input signal to cause said second cascode switch means to switch, wherein said reference voltage perturbation circuitry comprises a pull-down switch arranged to selectively couple said reference node to a ground voltage in dependence upon a signal generated in said first voltage section in response to detection of a transition of said input signal.

* * * * *